United States Patent [19]

Kumabe et al.

[11] Patent Number: 4,592,061
[45] Date of Patent: May 27, 1986

[54] TRANSVERSE JUNCTION STRIPE LASER WITH STEPS AT THE END FACES

[75] Inventors: Hisao Kumabe; Toshio Sogo; Saburo Takamiya, all of Hyogo, Japan

[73] Assignee: Mitsubishi Denki Kabushiki Kaisha, Tokyo, Japan

[21] Appl. No.: 411,188

[22] Filed: Aug. 25, 1982

[30] Foreign Application Priority Data

Aug. 31, 1981 [JP] Japan ............................. 56-137328

[51] Int. Cl.⁴ .............................................. H01S 3/19
[52] U.S. Cl. ........................................ 372/45; 357/17; 372/47
[58] Field of Search ................. 372/44, 45, 46, 48, 372/47; 357/17

[56] References Cited

U.S. PATENT DOCUMENTS

| 4,183,038 | 1/1980 | Namizaki et al. | 372/47 |
| 4,334,311 | 6/1982 | Oomura et al. | 372/47 |

FOREIGN PATENT DOCUMENTS

| 0162289 | 12/1980 | Japan | 372/45 |
| 0050592 | 5/1981 | Japan | 372/47 |
| 56-69884A | 6/1981 | Japan | 372/47 |
| 0093389 | 7/1981 | Japan | 372/45 |
| 56-94793A | 7/1981 | Japan | 372/47 |

OTHER PUBLICATIONS

H. Yonezu et al., "High Optical Power Density Emission from a Window-Stripe AlGaAs Double-Heterostructure Laser", Appl. Phys. Letters, 34(10), 15 May 1979, pp. 637-639.

Primary Examiner—James W. Davie
Attorney, Agent, or Firm—Sughrue, Mion, Zinn, Macpeak and Seas

[57] ABSTRACT

A semiconductor laser is provided with an active layer which is bent at an angle at both ends of the resonator so that both ends of the waveguide path are formed by semiconductor cladding layers. The structure is effective in increasing the obtainable optical density while decreasing absorption at the waveguide ends.

4 Claims, 5 Drawing Figures

TRANSVERSE JUNCTION STRIPE LASER WITH STEPS AT THE END FACES

BACKGROUND OF THE INVENTION

This invention relates to an improvement in a semiconductor laser device known in the art as a TJS (Transverse Junction Stripe) laser device.

FIG. 1 is a perspective view showing one example of the structure of a conventional TJS laser device. A method of manufacturing the laser device and the characteristics of the same will be briefly described. A first n-type aluminum gallium arsenic ($Al_yGa_{1-y}As$) cladding layer 2, an n-type $Al_xGa_{1-x}As$ active layer 3, a second n-type $Al_yGa_{1-y}As$ cladding layer 4 and an n-type GaAs contact layer 5 are grown on a semi-insulating gallium arsenic (GaAs) crystalline substrate 1 doped with chromium (Cr), in the stated order, according to a conventional liquid-phase epitaxial method. Thereafter, zinc (Zn) is selectively diffused from the surface of the n-type GaAs contact layer 5 and heat treatment driving-in is carried out, so that a p-type region 6 and a p+ type region 7 are formed as shown in FIG. 1. In succession, the p-n junction of the GaAs contact layer 5 is subjected to mesa-etching, and p and n electrodes 8 are formed on the p- and n-type parts on both sides thereof, respectively. In FIG. 1, reference numeral 9 designates the rear surface, namely, a metal layer.

As the diffusion potential of the p-n junction formed in the $Al_xGa_{1-x}As$ active layer 3 is lower than that of the p-n junctions in each of the $Al_yGa_{1-y}As$ clad layers 2 and 4 (where y>x), when a forward voltage is applied across the p and n electrodes 8, current flows collectively in the p-n junction of the $Al_xGa_{1-x}As$ active layer 3, as a result of which laser oscillation takes place near the junction. In this case, a pair of crystalline end faces 10 perpendicular to the p-n junction surface in the $Al_xGa_{1-x}As$ layer 3 are employed as the resonator mirror facets of the laser. The conventional TJS laser device is advantageous in that the oscillation threshold current is low and a stable single mode oscillation is obtained. However, since the structure of the conventional TJS laser device is such that the active region must be narrow in order to obtain single mode oscillation, it is fundamentally difficult to obtain an optical output power larger than 10 mW per surface. In the active region of the above-described conventional TJS laser device, the thickness of the active layer 3 is about 0.2 μm, the width of the p-type region 6 formed by diffusion is about 2 μm, and the area of the corresponding effective light emission region 11 is generally about $0.5\times2$ μm². The conventional TJS laser device is disadvantageous in that when the optical output is more than 10 mW/facet, i.e., when the optical output density is more than about $10^6$ Watts/cm², the device undergoes so-called optical mirror damage (OMD), i.e., it breaks down. The OMD is caused by the fusion of the laser end face. That is, the OMD phenomenon is a breakage phenomenon which takes place with the optical output as the critical point as the optical output is gradually increased, for instance because the strength of the electrical field near the mirror facet 10 is larger than that of inner portion of resonator, and the optical absorption is increased near the end face.

Accordingly, two methods may be employed to increase the laser optical output. In one of the two methods, the optical power density, which causes the above-described OMD, is increased to a larger value. In the other method, the light emitting area is increased, so that the effective optical output is increased without increasing the optical output density. In the case of the latter method, when it is required to provide a single-mode laser, the enlargeable light emitting area is limited to a certain value. That is, the maximum area is of the order of $1\times5$ μm² because of the thickness and width limitations of the light emitting region 11. In this case, the optical output is not more than five times the conventional value.

For the former method in which the optical density is effectively increased, theoretically the optical absorption of the resonator end face 10 should be decreased as much as possible.

FIG. 2 is a perspective view of a conventional TJS laser device which has been improved according to the above-described principle. In this structure, the arrangement of the epitaxially grown layers is similar to that in FIG. 1. However, it should be noted that the structure is different from that in FIG. 1 in that a crank-shaped waveguide path is formed near the resonator end face 10. That is, the p-type region 6 included in the p-type $Al_xGa_{1-x}As$ active layer, which is the active region, is L-shaped—bent in the form of a crank—near the resonator end face 10 as indicated at 12 in FIG. 2. Therefore, with the device having the above-described structure, the laser beam oscillates as it progates in the straight p-type region 6 occupying the middle part of the device and in the n-type region near the two end faces 10. Electrons contributing to laser oscillation are injected into only the straight p-n junction which is formed in the middle portion of the device and is perpendicular to the resonator end faces 10. The current flowing in the p-n junction of the part 12 which is bent in the form of a crank does not directly contribute to the laser oscillation. The light which is emitted near the straight p-n junction in the middle portion of the device propagates in the p-type region 6 and the n-type regions at both ends in a direction perpendicular to the resonator end faces 10 (i.e., in the direction of the resonator), is reflected by the two end faces 10 and amplified, as a result of which the light oscillates at a certain current value (threshold value). In general, in a laser device having the structure shown in FIG. 2, because the n-type region near the resonator end face 10 has a larger forbidden band gap than the p-type region, optical absorption when the light emitted from the p-type region propagates in the n-type region is smaller than the absorption when it propagates in the p-type region 6. Thus, the improved structure described above can solve the problem accompanying the conventional structure in FIG. 1 where the optical absorption was increased near the resonator end face 10. It has been confirmed that the optical density limit at which OMD occurs as described above is increased, for instance, to $2\times10^7$ Watts/cm² in the case of the crank type structure from $1\times10^6$ Watts/cm² in the case of the conventional one. FIG. 3 is a plan view of the crank type TJS laser device. The laser beam oscillates and is emitted passing through the region indicated by the arrow.

The above-described crank type laser device is still disadvantageous in the following points:

Since the crank-shaped part 12 is formed by diffusion, the corners especially are not rectilinear that is, they are substantially rounded. Accordingly, the length of the crank-shaped part 12, i.e., the length of the n-region deviates from the design value (which is, for instance, the value on the mask pattern), and control accuracy is decreased by as much. Thus, the device suffers from difficulties in that the threshold current is increased or becomes non-uniform. Another disadvantage is as follows: The difference in forbidden band gap between the p-type region 6 and the n-type region of the crank-shaped part 12 where the laser beam propagates is, for instance, 50 to 60 meV, and the difference in optical absorption therebetween is extremely small. Accordingly, in the case where the length of the crank-shaped part 12 is made shorter in order to decrease the threshold current value, at the worst the effectiveness of the crank structure may be lost because of the increasing electric field of a region in the p-type region in which electron injection is carried out which is closest to the n-type region of the crank-shaped part 12. Therefore, in this case, the device cannot operate stably with a large optical output.

SUMMARY OF THE INVENTION

In view of the foregoing, an object of this invention is to provide a TJS laser device in which the crank-shaped parts at both ends of the resonator are formed so as to be in the thickness direction of the semiconductor device, whereby the advantages of the crank structure are fully utilized and high power operation may be stably carried out.

BRIEF DESCRIPTION OF THE DRAWINGS

FIGS. 4A and 4B illustrate one embodiment of the invention, wherein FIGS. 4A and 4B are respectively a plan view and a front view of a semiconductor laser device according to the invention.

DETAILED DESCRIPTION OF THE PREFERRED EMBODIMENTS

Figure 4A:
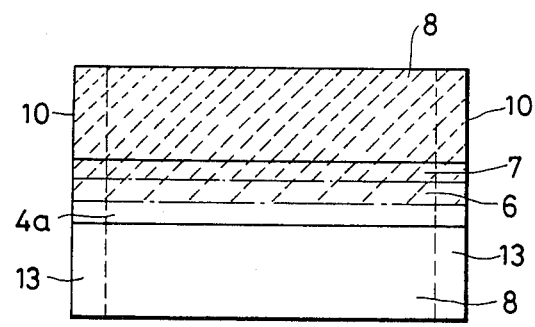
Figure 4B:
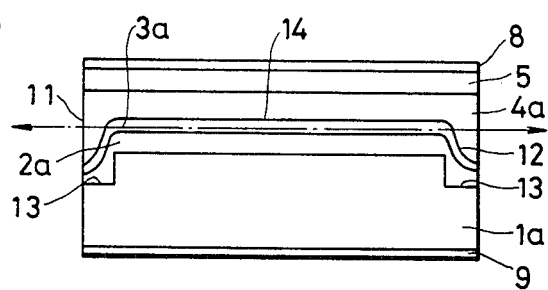

FIGS. 4A and 4B illustrates the structure of one embodiment of this invention. In FIGS. 4A and B illustrate, those parts which have been described with reference to the above described devices are therefore similarly numbered. In the embodiment of FIGS. 4A and 4B, grooves 13 each having a suitable length and width are formed in both sides of the upper surface of a semi-insulating GaAs crystalline substrate 1a doped with Cr. A first n-type $Al_yGa_{1-y}As$ cladding layer 2a, an n-type $Al_xGa_{1-x}As$ active layer 3a, a second n-type $Al_yGa_{1-y}As$ cladding layer 4a and an n-type GaAs contact layer 5 are formed on the thus treated substrate 1a by epitaxial growth. The structure as shown in FIGS. 4A and 4B can be obtained by suitably selecting the growth speed and the temperature. Then, similarly to the case of the conventional device, a p-type region 6 and a p+-type region 7 are formed by Zn diffusion and heat treatment. Thereafter, the p-n junction of the GaAs contact layer 5 is selectively subjected to mesa etching, to form p and n electrodes. Thus, the device as shown in FIGS. 4A and 4B results.

Figure 1:
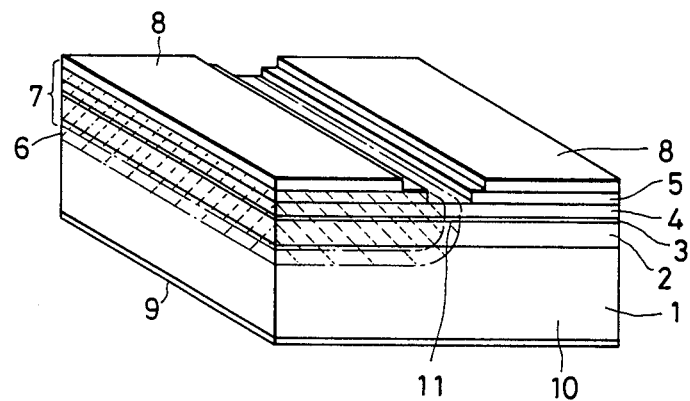
FIG. 1 is a perspective view showing one example of the structure of a conventional TJS laser device.
Figure 2:
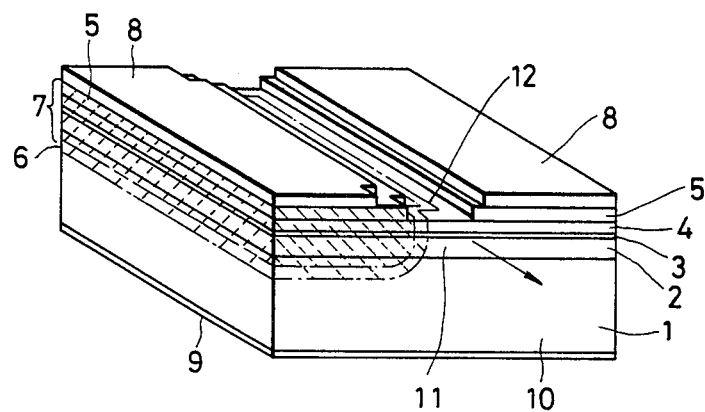
FIG. 2 is a perspective view showing one example of the structure of an improved TJS laser device.
Figure 3:
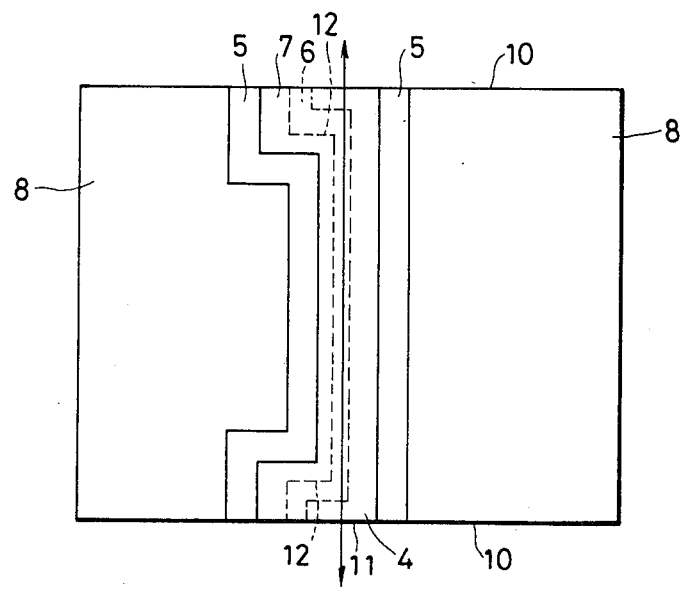
FIG. 3 is a plan view of the device shown in FIG. 2.

In this structure, the n-type $Al_xGa_{1-x}As$ active layer 3a is bent in the thickness direction of the epitaxial layers near the end faces 10 thereof, to form crank-shaped parts 12. The region into which current is injected for laser oscillation is the straight part 14 of the resonator. Light emitted here passes through the straight part 14 and propagates through the second $Al_yGa_{1-y}As$ cladding layer 4a from the crank-shaped part 12 to the end face 10, thus being amplified and oscillating. In this case, as the second $Al_yGa_{1-y}As$ cladding layer 4a has a larger forbidden band gap than does the $Al_xGa_{1-x}As$ active layer 3a (because y > x), the absorption of the propagating light at the crank-shaped part 12 is decreased by as much as the difference therebetween. In the above-described structure according to the invention, the difference in the energy gap between the second $Al_yGa_{1-y}As$ cladding layer 4a and the $Al_xGa_{x-1}As$ active layer 3a is 400 to 500 meV, and optical absorption is effectively decreased when the optical path length of the crank-shaped part 12 is short. When compared with the energy gap difference of 50 to 60 meV in the conventional device shown in FIG. 1 or 2, the energy gap difference in the device of the invention is considerably large. This is effective in decreasing optical absorption near the resonator end face 10.

In the structure according to the invention, the crank-shaped parts 12 are created by forming the grooves 13 in the substrate 1a in advance. Therefore, the finished dimensions, for example, the crank length can be made substantially equal to the design values. Therefore, the fundamental oscillation characteristic of the laser device can be readily and uniformly reproduced. Thus, a laser device of high power and stable operation can be readily provided according to the invention. It has been confirmed that, with the structure of the invention, stable oscillation characteristics are obtained even when the optical density is more than $10^7$ Watts/cm².

In addition to the above-described embodiment, the crank-shaped part may be formed by partly protruding the substrate, or steps may be formed on the first clad layer. The technical concept of this invention may be applied to laser devices using semiconductor materials such as InP systems, materials and InGaAsP systems materials rather than AlGaAs systems materials.

As was described above in detail, in the semiconductor laser device according to the invention, although the larger part or the middle portion of the waveguide path forming the resonator is the active layer, the two end portions are formed with a first or second cladding layer of large forbidden band gap. Therefore, the optical absorption at both end portions is decreased, and laser oscillation of large optical density can be stably carried out.

What is claimed is:

1. A semiconductor laser device, comprising:
a first semiconductor layer of a first conductivity type, a semiconductor active layer of said first conductivity type and a second semiconductor layer of said first conductivity type formed on a semi-insulating semiconductor substrate in the stated order in a first dimension, said first and second semiconductor layers having a larger forbidden band gap than said semiconductor active layer by 400–500 meV, a semiconductor region of a second conductivity type formed in predetermined regions of the first, active and second layers and extending into said semi-insulating substrate, said semiconductor region forming pn junctions with said first active and second layers, reflectors formed on opposed ends of said semiconductor laser device to form a resonator, and two electrodes connected respectively to said semiconductor region and a portion of said second semiconductor layer which is of said first conductivity type, said active layer being substantially bent in said first dimension in a direction away from a main surface thereof at and along the entirety of both end portions of said resonator between said reflectors, and such that a middle portion of a wave-guide path between said reflectors comprises said active layer while both end portions thereof are formed of one of said first and second semiconductor layers.

2. A semiconductor laser device as claimed in claim 1, wherein said substrate includes steps formed in both end portions of the upper surface thereof, and wherein said first semiconductor layer, the semiconductor active layer and the second semiconductor layer are formed thereon in the stated order.

3. A semiconductor laser device as claimed in claim 1, including steps formed in both end portions of said first semiconductor layer formed on said semi-insulating semiconductor substrate, said semiconductor active layer and said second semiconductor layer being formed on said first semiconductor layer in the stated order.

4. A semiconductor laser device as claimed in claim 1, wherein said first and second semiconductor layers are of $Al_yGa_{1-y}As$ and said semiconductor active layer is of $Al_xGa_{1-x}As$ where $y > x$.

* * * * *